US005381357A

United States Patent [19]
Wedgwood et al.

[11] Patent Number: 5,381,357
[45] Date of Patent: Jan. 10, 1995

[54] COMPLEX ADAPTIVE FIR FILTER

[75] Inventors: Janet E. Wedgwood, Bethpage; John F. Petrsoric, New Hyde Park, both of N.Y.

[73] Assignee: Grumman Corporation, Bethpage, N.Y.

[21] Appl. No.: 68,932

[22] Filed: May 28, 1993

[51] Int. Cl.[6] ............................................. G06F 15/31
[52] U.S. Cl. ............................ 364/724.16; 364/724.19
[58] Field of Search ...................... 364/724.16, 724.19, 364/724.13

[56] References Cited

U.S. PATENT DOCUMENTS

| | | | |
|---|---|---|---|
| 4,893,265 | 1/1990 | Hirosaki | 364/724.13 |
| 4,947,362 | 8/1990 | Bui | 364/724.19 |
| 5,245,561 | 9/1993 | Sugiyama | 364/724.16 |
| 5,280,255 | 1/1994 | Nishikawa | 364/724.16 |
| 5,282,155 | 1/1994 | Jones | 364/724.19 |

*Primary Examiner*—David H. Malzahn
*Attorney, Agent, or Firm*—Scully, Scott, Murphy & Presser

[57] ABSTRACT

A complex adaptive Finite-Impulse-Response filter for processing complex digital data having real and imaginary data portions that includes a first data path for receiving and processing the real data portion of the complex input and a second data path for receiving and processing the imaginary data portion. Each first and second data path includes a corresponding plurality of adaptive weight circuits and accumulator circuits to perform respectively, multiplications of input data with a set of updatable coefficient data and accumulations of the multiplication results obtained. Two of multiplication results are obtained for each data path and a subset from each are accumulated to form a real output portion and imaginary output potion for the filter. A time delay circuit is provided to allow for proper time multiplexing of the imaginary output portion. The plurality of adaptive weight circuits have associated therewith first and secondary memory storage banks for storing the current coefficient data values. Alternate first and second memory storage banks are provided to receive updated coefficient data for use by the adaptive weight circuits at the request of the host processor. While the coefficient data stored in the first and second memory storage circuits are being used by the adaptive weight circuits for processing thereof, the coefficient data values may be updated in the first alternate and second alternate memory storage banks and vice versa.

13 Claims, 17 Drawing Sheets

| CLOCK | INPUT | mult 5 | accum 5 | mult 4 | accum 4 | mult 3 |
|---|---|---|---|---|---|---|
| 0 | yin(0) | yin(0)·a5 | 0 | 0 | 0 | yin(0)·a3 |
| 1 | yin(1) | 0 | yin(0)·a5 | yin(1)·b4 | 0 | 0 |
| 2 | yin(2) | yin(2)·a5 | 0 | 0 | yin(0)·a5 + yin(1)·b4 | yin(2)·a3 |
| 3 | yin(3) | 0 | yin(2)·a5 | yin(3)·b4 | 0 | 0 |
| 4 | yin(4) | yin(4)·a5 | 0 | 0 | yin(2)·a5 + yin(3)·b4 | yin(4)·a3 |
| 5 | yin(5) | 0 | yin(4)·a5 | yin(5)·b4 | 0 | 0 |
| 6 | yin(6) | yin(6)·a5 | 0 | 0 | yin(4)·a5 + yin(5)·b4 | yin(6)·a3 |
| 7 | yin(7) | 0 | yin(6)·a5 | yin(7)·b4 | 0 | 0 |
| 8 | yin(8) | yin(8)·a5 | 0 | 0 | yin(6)·a5 + yin(7)·b4 | yin(8)·a3 |
| 9 | yin(9) | 0 | yin(8)·a5 | yin(9)·b4 | 0 | 0 |

FIG.6A1

| accum 3 | mult 2 | accum 2 | mult 1 | accum 1 | mult 0 |
|---|---|---|---|---|---|
| 0 | 0 | 0 | $yin(0) \cdot a_1$ | 0 | 0 |
| $yin(0) \cdot a_3$ | $yin(1) \cdot b_2$ | 0 | 0 | $yin(0) \cdot a_1$ | $yin(1) \cdot b_0$ |
| 0 | 0 | $yin(0) \cdot a_3 +$ $yin(1) \cdot b_2$ | $yin(2) \cdot a_1$ | 0 | 0 |
| $yin(0) \cdot a_5 +$ $yin(1) \cdot b_4 +$ $yin(2) \cdot a_3$ | $yin(3) \cdot b_2$ | 0 | 0 | $yin(0) \cdot a_3 +$ $yin(1) \cdot b_2 +$ $yin(2) \cdot a_1$ | $yin(3) \cdot b_0$ |
| 0 | 0 | $yin(0) \cdot a_5 +$ $yin(1) \cdot b_4 +$ $yin(2) \cdot a_3 +$ $yin(3) \cdot b_2$ | $yin(4) \cdot a_1$ | 0 | 0 |
| $yin(2) \cdot a_5 +$ $yin(3) \cdot b_4 +$ $yin(4) \cdot a_3$ | $yin(5) \cdot b_2$ | 0 | 0 | $yin(0) \cdot a_5 +$ $yin(1) \cdot b_4 +$ $yin(2) \cdot a_3 +$ $yin(3) \cdot b_2 +$ $yin(4) \cdot a_1$ | $yin(5) \cdot b_0$ |
| 0 | 0 | $yin(2) \cdot a_5 +$ $yin(3) \cdot b_4 +$ $yin(4) \cdot a_3 +$ $yin(5) \cdot b_2$ | $yin(6) \cdot a_1$ | 0 | 0 |
| $yin(4) \cdot a_5 +$ $yin(5) \cdot b_4 +$ $yin(6) \cdot a_3$ | $yin(7) \cdot b_2$ | 0 | 0 | $yin(2) \cdot a_5 +$ $yin(3) \cdot b_4 +$ $yin(4) \cdot a_3 +$ $yin(5) \cdot b_2 +$ $yin(6) \cdot a_1$ | $yin(7) \cdot b_0$ |
| 0 | 0 | $yin(4) \cdot a_5 +$ $yin(5) \cdot b_4 +$ $yin(6) \cdot a_3 +$ $yin(7) \cdot b_2$ | $yin(8) \cdot a_1$ | 0 | 0 |
| $yin(6) \cdot a_5 +$ $yin(7) \cdot b_4 +$ $yin(8) \cdot a_3$ | $yin(9) \cdot b_2$ | 0 | 0 | $yin(4) \cdot a_5 +$ $yin(5) \cdot b_4 +$ $yin(6) \cdot a_3 +$ $yin(7) \cdot b_2 +$ $yin(8) \cdot a_1$ | $yin(9) \cdot b_0$ |

FIG.6A2

| accum 0= YHAT | OUTPUT error = accum 0 + din(n−6) | din | | | | | | | comments |
|---|---|---|---|---|---|---|---|---|---|
| | | n | n−1 | n−2 | n−3 | n−4 | n−5 | n−6 | |
| 0 | 0 | din(0) | | | | | | | |
| 0 | 0 | din(1) | din(0) | | | | | | |
| yin(0)·a1+ yin(1)·b0 | 0 | din(2) | din(1) | din(0) | | | | | |
| 0 | yin(0)·a1+ yin(1)·b0+ junk | din(3) | din(2) | din(1) | din(0) | | | | |
| yin(0)·a3+ yin(1)·b2+ yin(2)·a1+ yin(3)·b0 | 0 | din(4) | din(3) | din(2) | din(1) | din(0) | | | |
| 0 | yin(0)·a3+ yin(1)·b2+ yin(2)·a1+ yin(3)·b0+ junk | din(5) | din(4) | din(3) | din(2) | din(1) | din(0) | | |
| yin(0)·a5+ yin(1)·b4+ yin(2)·a3+ yin(3)·b2+ yin(4)·a1+ yin(5)·b0 | 0 | din(6) | din(5) | din(4) | din(3) | din(2) | din(1) | din(0) | YHAT = Re[Ryw(0)] = cout(6) |
| 0 | yin(0)·a5+ yin(1)·b4+ yin(2)·a3+ yin(3)·b2+ yin(4)·a1+ yin(5)·b0 + bin(0) | din(7) | din(6) | din(5) | din(4) | din(3) | din(2) | din(1) | OUTPUT = Re[Ryw(0)] Re[d(0)] |
| yin(2)·a5+ yin(3)·b4+ yin(4)·a3+ yin(5)·b2+ yin(6)·a1+ yin(7)·b0 | 0 | din(8) | din(7) | din(6) | din(5) | din(4) | din(3) | din(2) | YHAT = Re[Ryw(1)] = cout(8) |
| 0 | yin(2)·a5+ yin(3)·b4+ yin(4)·a3+ yin(5)·b2+ yin(6)·a1+ yin(7)·b0+ din(2) | | | | | | | | OUTPUT = Re[Ryw(1)] + Re[d(1)] |

FIG.6A3

| CLOCK | INPUT (from storage) | mult 5 | accum 5 | mult 4 | accum 4 | mult 3 |
|---|---|---|---|---|---|---|
| 0 | Store yin(0) | 0 | 0 | 0 | 0 | 0 |
| 1 | yin(0) | yin(0)·b5 | 0 | 0 | 0 | yin(0)·b3 |
| 2 | yin(1) | 0 | yin(0)·b5 | yin(1)·a4 | 0 | 0 |
| 3 | yin(2) | yin(2)·b5 | 0 | 0 | yin(2)·a5<br>yin(1)·a4 | yin(2)·b3 |
| 4 | yin(3) | 0 | yin(2)·b5 | yin(3)·a4 | 0 | 0 |
| 5 | yin(4) | yin(4)·b5 | 0 | 0 | yin(2)·b5+<br>yin(3)·a4 | yin(4)·b3 |
| 6 | yin(5) | 0 | yin(4)·b5 | yin(5)·a4 | 0 | 0 |
| 7 | | yin(6)·b5 | 0 | 0 | 0 | yin(6)·b3 |
| 8 | | 0 | yim(6)·b5 | yin(7)·a4 | 0 | 0 |
| 9 | | 0 | 0 | 0 | 0 | 0 |
| 10 | | | | | | |

FIG.6B1

| accum 3 | mult 2 | accum 2 | mult 1 | accum 1 | mult 0 |
|---|---|---|---|---|---|
| 0 | 0 | 0 | 0 | 0 | 0 |
| 0 | 0 | 0 | $yin(0) \cdot b_1$ | 0 | 0 |
| $yin(0) \cdot b_3$ | $yin(1) \cdot a_2$ | 0 | 0 | $yin(0) \cdot b_1$ | $yin(1) \cdot a_0$ |
| 0 | 0 | $yin(0) \cdot b_3 +$ $yin(1) \cdot a_2$ | $yin(2) \cdot b_1$ | 0 | 0 |
| $yin(0) \cdot b_5 +$ $yin(1) \cdot a_4 +$ $yin(2) \cdot b_3$ | $yin(3) \cdot a_2$ | 0 | 0 | $yin(0) \cdot b_3 +$ $yin(1) \cdot a_2 +$ $yin(2) \cdot b_1$ | $yin(3) \cdot a_0$ |
| 0 | 0 | $yin(0) \cdot b_5 +$ $yin(1) \cdot a_4 +$ $yin(2) \cdot b_3 +$ $yin(3) \cdot a_2$ | $yin(4) \cdot b_1$ | 0 | 0 |
| $yin(2) \cdot b_5 +$ $yin(3) \cdot a_4 +$ $yin(4) \cdot b_3$ | $yin(3) \cdot a_2$ | 0 | 0 | $yin(0) \cdot b_5 +$ $yin(1) \cdot a_4 +$ $yin(2) \cdot b_3 +$ $yin(3) \cdot a_2 +$ $yin(4) \cdot d_1$ | $yin(5) \cdot a_0$ |
| 0 | 0 | $yin(2) \cdot b_5 +$ $yin(3) \cdot a_4 +$ $yin(4) \cdot b_3 +$ $yin(5) \cdot a_2$ | $yin(6) \cdot b_1$ | 0 | 0 |
| 0 | $yin(7) \cdot a_2$ | 0 | 0 | $yin(2) \cdot b_5 +$ $yin(3) \cdot a_4 +$ $yin(4) \cdot b_3 +$ $yin(5) \cdot a_2 +$ $yin(6) \cdot b_1$ | $yin(7) \cdot a_0$ |
| 0 | 0 | 0 | 0 | 0 | 0 |
| | | | | | |

FIG. 6B2

| accum O= YHAT | OUTPUT error = accum O + din(n−6) | din n  n−1  n−2  n−3  n−4  n−5  n−6 | comments |
|---|---|---|---|
| 0 | 0 | din(0) | |
| 0 | 0 | din(1) din(0) | |
| 0 | 0 | din(2) din(1) din(0) | |
| yin(0)·b1+ yin(1)·a0 | 0 | din(3) din(2) din(1) din(0) | |
| 0 | yin(0)·b1+ yin(1)·a0 | din(4) din(3) din(2) din(1) din(0) | |
| yin(0)·b3+ yin(1)·a2+ yin(2)·b1+ yin(3)·a0 | 0 | din(5) din(4) din(3) din(2) din(1) din(0) | |
| 0 | yin(0)·b3+ yin(1)·a2+ yin(2)·d1+ yin(3)·a0 | din(6) din(5) din(4) din(3) din(2) din(1) din(0) | |
| yin(0)·b5+ yin(1)·a4+ yin(2)·b3+ yin(3)·a2+ yin(4)·b1+ yin(5)·a0 | 0 | din(7) din(6) din(5) din(4) din(3) din(2) din(1) | YHAT = Im [Ryw(0)] = cout(7) |
| 0 | 0 | din(8) din(7) din(6) din(5) din(4) din(3) din(2) | OUTPUT = Im [Ryw(0)] Im [d(0)] |
| yin(2)·b5+ yin(3)·a4+ yin(4)·b3+ yin(5)·a2+ yin(6)·b1+ yin(7)·a0 | 0 | din(9) din(8) din(7) din(6) din(5) din(4) din(3) | YHAT = Im [Ryw(1)] = cout(9) |
| | | | OUTPUT = Im [Ryw(1)] +Im [d(1)] |

FIG.6B3

SWAPPING LOGIC

48 → WSWAPREQSA~=!(!WSWAPREQ~)
52 → WSWAPREQSDELA~:=!(!WSWAPREQSA~ & WSWAPREQDELA~ & MULTIPLYA)
55 → WSWAPREQSDELB~:=!(!WSWAPREQSA~ & MULTIPLYB & !WSWAPAKA~)
70 { 57 → WSWAPAKA~:=!(!WSWAPREQSDELA~ & WSWAPAKA~# !WSWAPAKB~ & ! WSWAPREQS~)
59 → WSWAPAKB~:=!(!WSWAPREQSDELB~ & WSWAPAKB~# !WSWAPAKA~ & ! WSWAPREQS~)
60 → WSWAPAK~:=!(!WSWAPAKA~ & !WSWAPAKB~)

LEGEND:
:= registered output
!x is true when x is low
y:=!(!x) means y will go low on the
next clock if x is low

# = Logical OR
& = Logical AND

FIG.7b

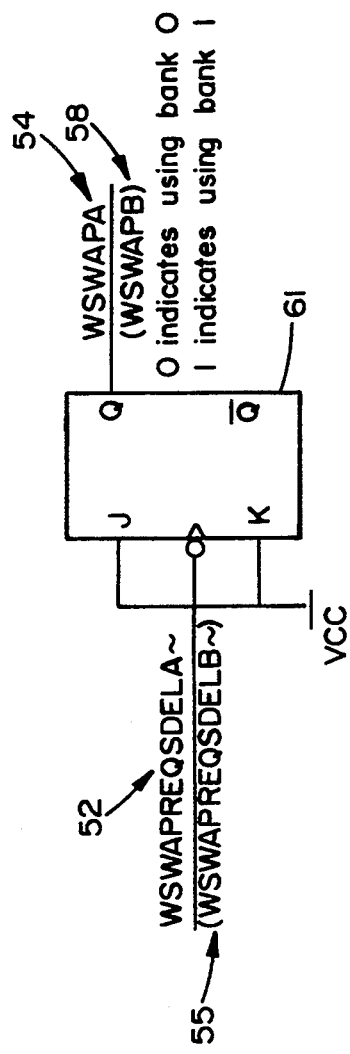

FIG.7c

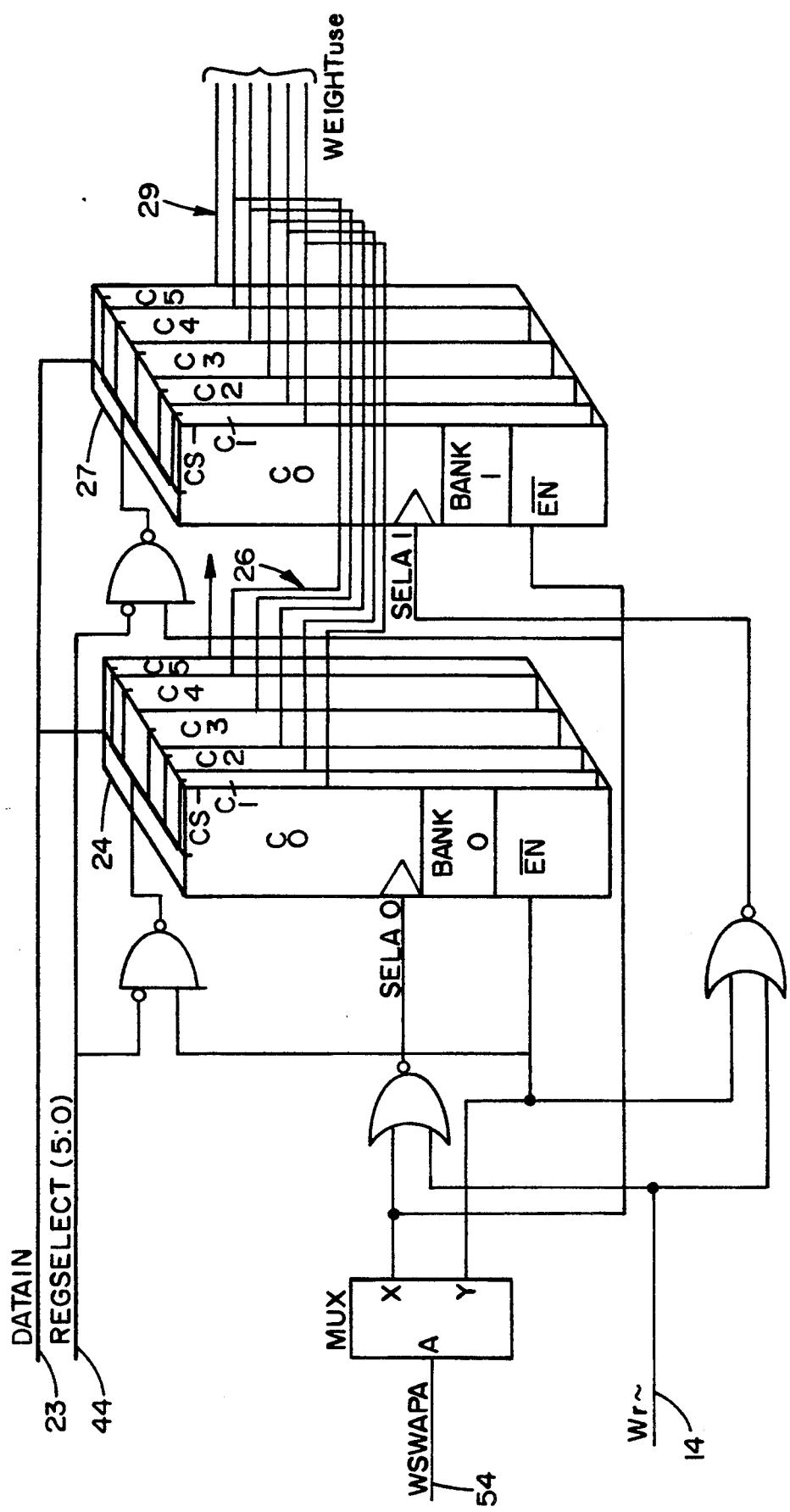

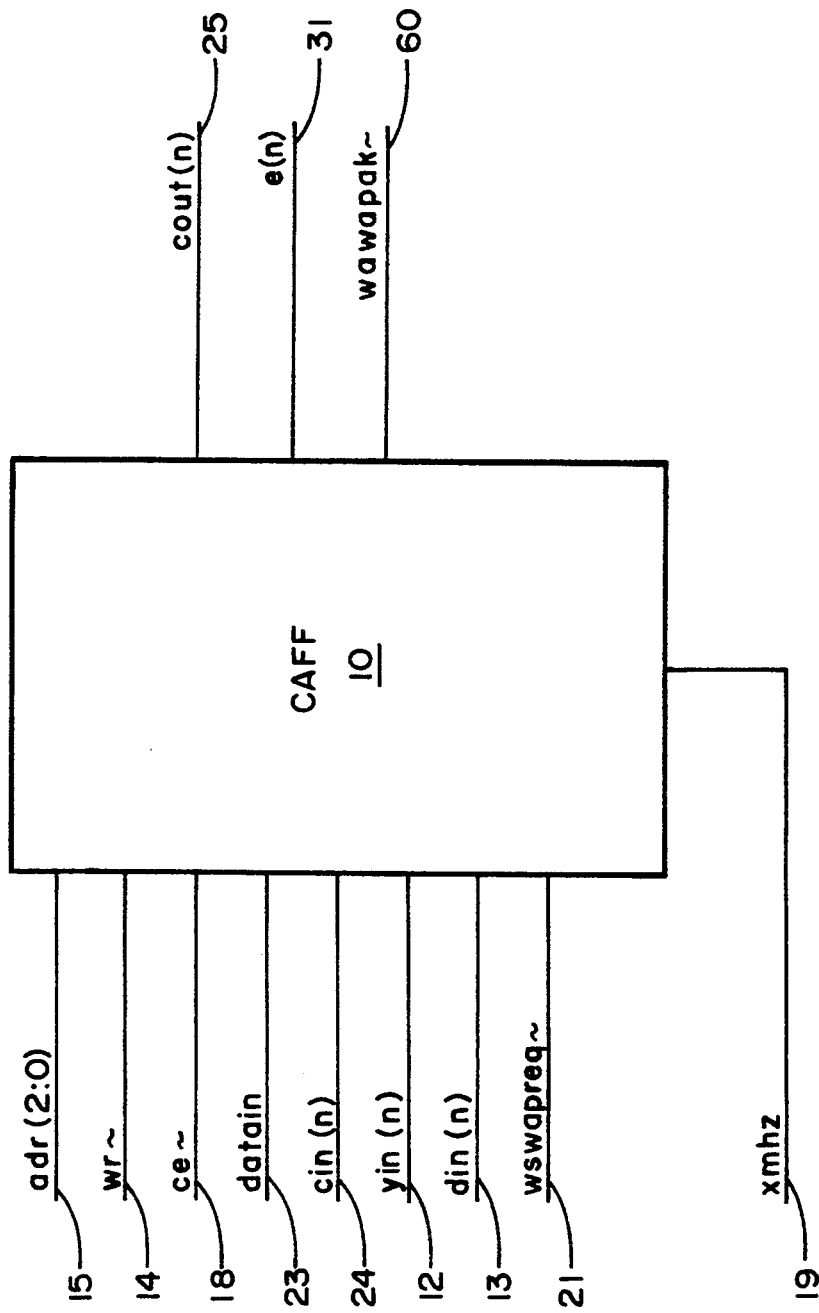

COMPLEX ADAPTIVE FIR FILTER

BACKGROUND OF THE INVENTION

1. Field of the Invention

The instant invention relates to a Finite Impulse Response filter that filters complex digital signals in a manner such that the real and imaginary parts of a complex digital signal are filtered separately in distinct parallel data paths. The filter is adaptive in that it includes circuitry that will update the multiplicands used as the complex weights used in the filtering process, and load them into the filter without interrupting or terminating the filtering process.

2. Discussion of the Prior Art

There presently exist numerous electrical and electronic devices that make use of microprocessors to process sampled data. The typical data operations required of the microprocessor includes multiplication, addition, subtraction, logical AND and OR, and repetitive combinations thereof, for e.g. multiply and divide. Though microprocessors are particularly useful for applications where speed and data handling size are not critical, they are not suitable for many data intensive applications. For instance, in radar and sonar systems, medical imaging systems, and speech recognition systems, huge amounts of data are usually required to be processed at fast speeds. For a typical microprocessor, a single multiply-accumulate operation may take as long as 25 clock cycles. To increase the processing speeds, a number of these systems now incorporate digital signal processors (DSP) processors which are microprocessors having architectures that are optimized to process the sampled data at high rates. The architecture of a DSP is designed to exploit the repetitive nature of signal processing. Thus, a DSP having a fast array multiplier and accumulator may execute the single multiply-accumulate operation in a single clock cycle.

The DSP chip may be utilized as an application-specific device that can perform one function more accurately, faster, and more cost-effectively. For example, an increasing number of digital filter and Fourier transform applications require DSP chips. A special type of digital filter, a Finite-Impulse-Response ("FIR") filter, i.e., a filter that is characterized as having an impulse response of finite length, is ideally used to achieve exact linear (or near linear) phase response. Ideally this is used in systems where it is paramount that the phase affects the shape of the output of the FIR filter by, at most, a time delay. In radar systems incorporating phased-array antennas, for example, digital FIR filters are required to process complex digital signals, i.e., signals having real and imaginary components. Usually, the filter functions to get rid of noise caused by antenna mismatch or clutter. When filtering complex digital signals, the real and imaginary parts of the digital signal and their time delayed versions are each multiplied by a complex weight and the results are then summed. To perform the filtering function, both real and imaginary parts of the weight and the negative of the imaginary part of the weight, must be made available as multiplicands (coefficients). Most digital filters are thus conveniently implemented using DSP chips having coefficient multiplier elements, adders or summing devices, and delay elements (memory storage devices). The filter is considered "adaptive" when the coefficients are variable and updated by a host processor that implements an updating algorithm.

There are presently available integrated circuit chips that are used for filtering digital signals. For instance, the INMOS signal processing chip IMSA100 is able to do up to 32 parallel multiplies and additions (or subtractions) and that makes it useful as a FIR filter. This particular DSP filter is designed for use in a microprocessor system, so that the coefficients may be loaded through an input port to one or two banks of registers or alternatively, to external ROM or RAM. When filtering real data, one bank of memory is used to provide the coefficients for the filter. For adaptive filtering, one bank of memory is used while the other is being updated with new coefficients. For complex adaptive filtering however, the two bank architecture becomes unusable, even at low data rates. This is because both banks of coefficients are required to produce the filter output, i.e., one bank produces the real output and the other produces the imaginary output. To update the coefficients, the filtering process has to be stopped while the new coefficients are being loaded in. Usually, the time required to load new coefficients is long compared to the data rate of most existing processors. In fact, most existing processors can do complex processing at only one-half the data rate.

To alleviate excessive delays in updating the coefficients, alternative designs have been implemented where the coefficients are accessed circularly from an external memory. Using appropriate control circuitry, one bank of memory can provide the coefficients to the filter while the other bank of memory is being updated. This arrangement relieves the updating problem but it does not take full advantage of the geometry of the complex filter and requires a significant amount of external control circuitry.

Additionally, in order to properly perform adaptive filtering, an error signal, which is calculated as the sum of the filter output signal and a "desired" input signal, must be provided as an output to the host processor to calculate the updated weight coefficients. Present DSP processors do not provide this capability and external adder circuitry is usually required to calculate the error for updating the weights. The need for an external adder and corresponding control circuitry degrades filter performance and takes up valuable circuit board area.

Most of the available FIR filter chips also require the need to fix and truncate the floating point result coming out of the host processor. This is due to the fact that the internal processing is not floating point. One consequence of this, is that the dynamic range usually required for adaptive processing, is not preserved.

In view of the foregoing limitations of the present generation of adaptive FIR filters, there exists the need for a complex adaptive FIR filter that can process complex digital signals more quickly and efficiently when the signal to be processed is a complex digital data and when the processing speed requirements of the data rate make commercially available FIR filter chips functionally prohibitive.

Therefore, it is the objective of the instant invention to provide a complex adaptive FIR filter having an internal processing architecture that features two parallel data paths, one which filters the real data stream of the complex signal and another which filters the complex data stream whereby the architecture takes maximum advantage of the time available to do the required calculations.

It is a further objective to provide a complex adaptive FIR filter that is able to do complex adaptive digital filtering without having to interrupt or stop the filtering process when the weight coefficients are being updated.

It is another object of the invention to provide a complex adaptive FIR filter having an input for receiving a "desired" input signal and an adder element for enabling the generation of an error signal for more efficient adaptive filter implementation.

Another objective of the present invention is to provide a complex adaptive FIR filter that incorporates floating-point processing to preserve the dynamic range required for adaptive processing.

It is still another objective to provide a complex adaptive FIR filter that is designed as a standalone device that requires no external circuitry to interface to a host processor.

Still another objective is to provide a complex adaptive FIR filter that can be cascaded to allow the creation of longer filters for applying longer coefficient sets to the data stream.

Yet another objective of the present invention is to provide a complex adaptive FIR filter that provides a unique and efficient way to update the weight coefficients without having to provide significant amounts of hardware support.

SUMMARY OF THE INVENTION

The present invention is directed to a complex Finite-Impulse-Response filter with adaptive weights for processing complex digital data having real and imaginary input data portions. The filter comprises a first data path for processing the real input data portion of the input complex data. The first data path includes a first plurality of adaptive weight circuits for multiplying the real input data by predetermined coefficients to generate a set of multiplication results. A second data path is also provided for processing the imaginary input data portion of the input complex data. The second path includes a second plurality of adaptive weight circuits for multiplying the imaginary input data by predetermined coefficients to generate a set of multiplication results. The filter is also provided with a control circuit that provides the real input data simultaneously to the first plurality of adaptive weight circuits during a first time interval and successive first time intervals thereafter, and provides the imaginary input data simultaneously to the second plurality of adaptive weight circuit during a second time interval and successive second time intervals thereafter. A first plurality of accumulator circuits interconnect a first subset of the first plurality of adaptive weight circuits and a first subset of the second plurality of adaptive weight circuit to accumulate a first set of multiplication results therefrom to form a real data output portion for the filter. A one clock cycle delay circuit located in said first data path delays the multiplication of the real input data with a second subset of the first plurality of adaptive weight circuits by one time interval and a one clock cycle delay circuit located in the second data path delays the multiplication of the imaginary input data with a second subset of the second plurality of adaptive weight circuits. These first and second delay circuits ensure proper time multiplexing of the imaginary data output portion of the filter. A second plurality of accumulator circuits interconnect the second subset of the first plurality of adaptive weight circuits and the second subset of the second plurality of adaptive weight circuits to accumulate a second set of multiplication results therefrom to form the imaginary output data portion for the filter. The real and imaginary output data portions are multiplexed at the output of the filter to form the complex output signals.

The coefficient data values of the adaptive weight circuits are stored in two memory storage banks for access by the filter or host processor. These values can also be stored in alternative memory storage banks so that when data is accessed by the filter from the memory storage bank, data can be written to the alternate memory storage bank at the request of the host processor and vice versa. Continuous filter operation is assured by a coefficient swapping circuit that will only allow access to the updated predetermined coefficient values of the first subset of the first plurality and the second subset of the second plurality of adaptive weights during second time intervals. Likewise, the coefficient swapping circuit will only allow access to the predetermined coefficient values of the first subset of the second plurality and the second subset of the first plurality of adaptive weights during first time intervals.

Further benefits and advantages of the invention will become apparent from a consideration of the following detailed description given with reference to the accompanying drawings, which specify and show preferred embodiments of the invention.

BRIEF DESCRIPTION OF THE DRAWINGS

FIGS. 6A1–6A3 illustrate the tabulated results of the calculations obtained when processing the real data portion of a complex digital signal input to the filter of FIG. 5.

FIGS. 6B1–6B3 illustrate the tabulated results of the calculations obtained when processing the imaginary data portion of a complex digital signal input to the filter of FIG. 5.

FIG. 7b shows the logic truth table and its corresponding legend setting forth the signal conditions in the weight swapping circuitry necessary to perform weight swapping function.

FIG. 7c shows the digital logic circuit implemented to command the weight swapping to occur.

FIG. 8 shows a generalized block diagram of the circuitry that determines which memory bank is being written to and which memory bank is receiving the updated coefficients.

FIG. 9 is a pin-out diagram summarizing the Input/Output of the complex adaptive FIR filter of the present invention.

DESCRIPTION OF THE PREFERRED EMBODIMENTS

Figure 3:
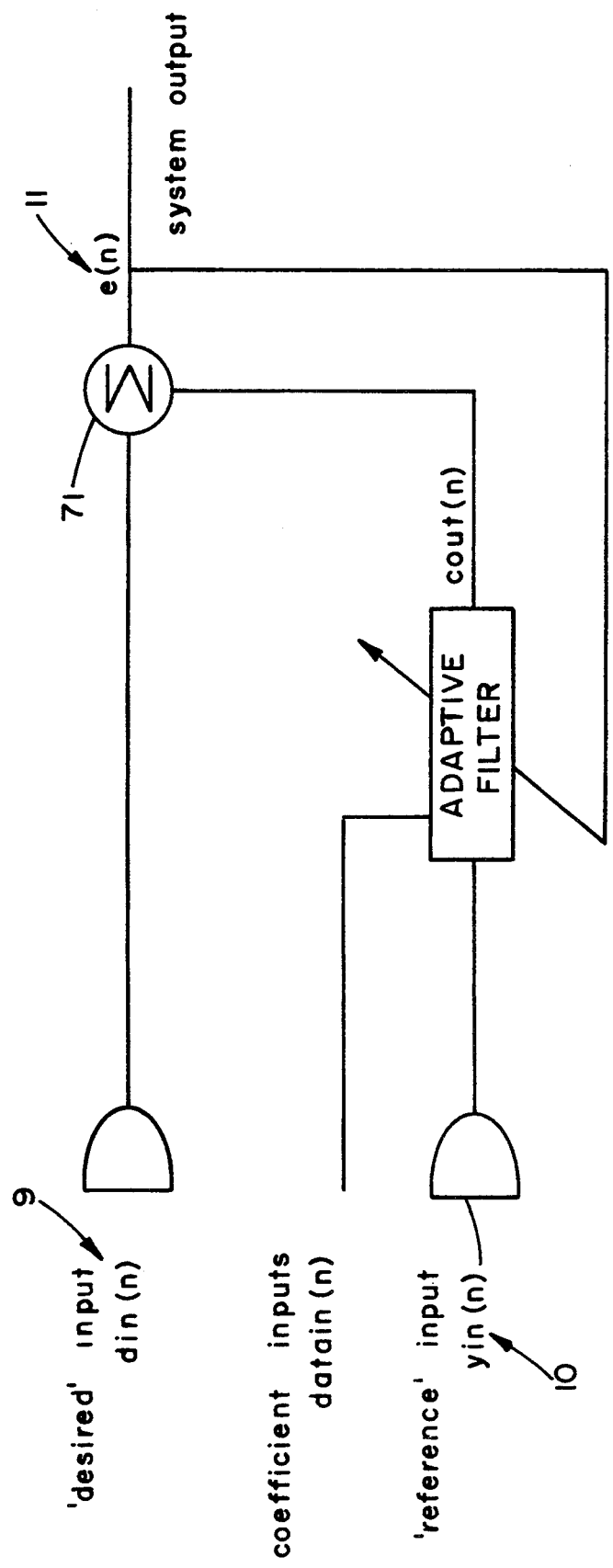
FIG. 3 shows a typical application for an adaptive filter which can be implemented using the filter of the present invention.

The present invention relates to a finite impulse response filter designed to process complex data. The filter comprises two parallel data paths, one which filters the real data stream and a second which filters the imaginary data stream. The filter processes complex digital signal by multiplying the signals and time delayed versions of the signals each by a complex weight and summing the results of these multiplications. Since the filter utilizes two parallel data paths, both the real and imaginary part of the complex weight, as well as the negative of the imaginary part of the weight must be available as multiplicands which are hereinafter referred to as coefficients. The coefficients are variable, therefore, the filter is capable of operation as an adaptive filter when interfaced to a host processor which executes the adaptive algorithm and updates the coefficients. Due to the particular geometry of complex digital signal processing, these parallel data paths take maximum advantage of the time available to do the required filtering calculations. The filter of the present invention also includes a "desired input" which eliminates the need for an external summing device to calculate the error term often needed to update the coefficients. FIG. 3 illustrates an application for the adaptive filter of the present invention which eliminates the need for external summing device 71.

Figure 1A:
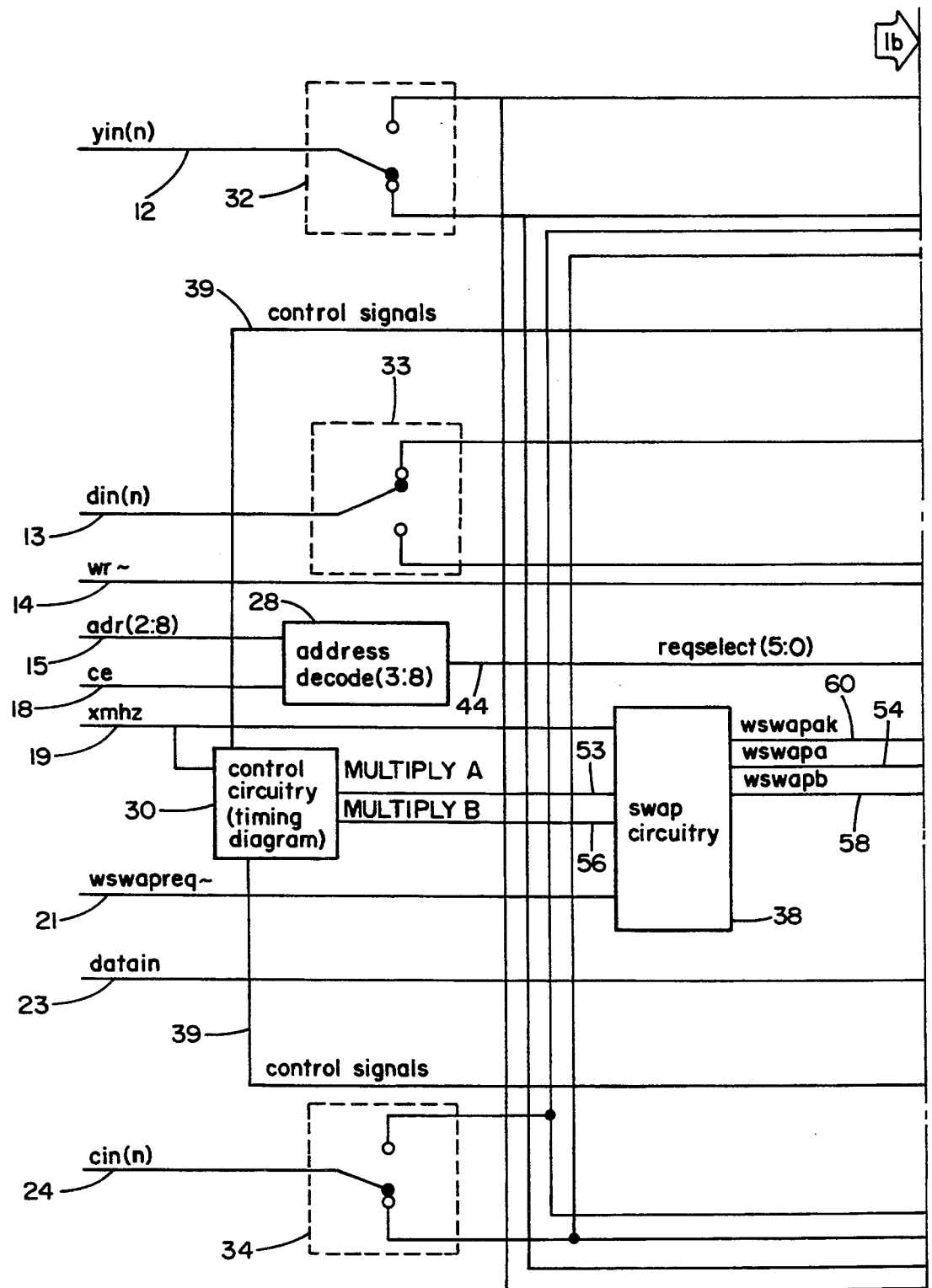
FIGS. 1a and 1b illustrate a block diagram of a system implementing the adaptive FIR filter of the present invention.
Figure 1B:
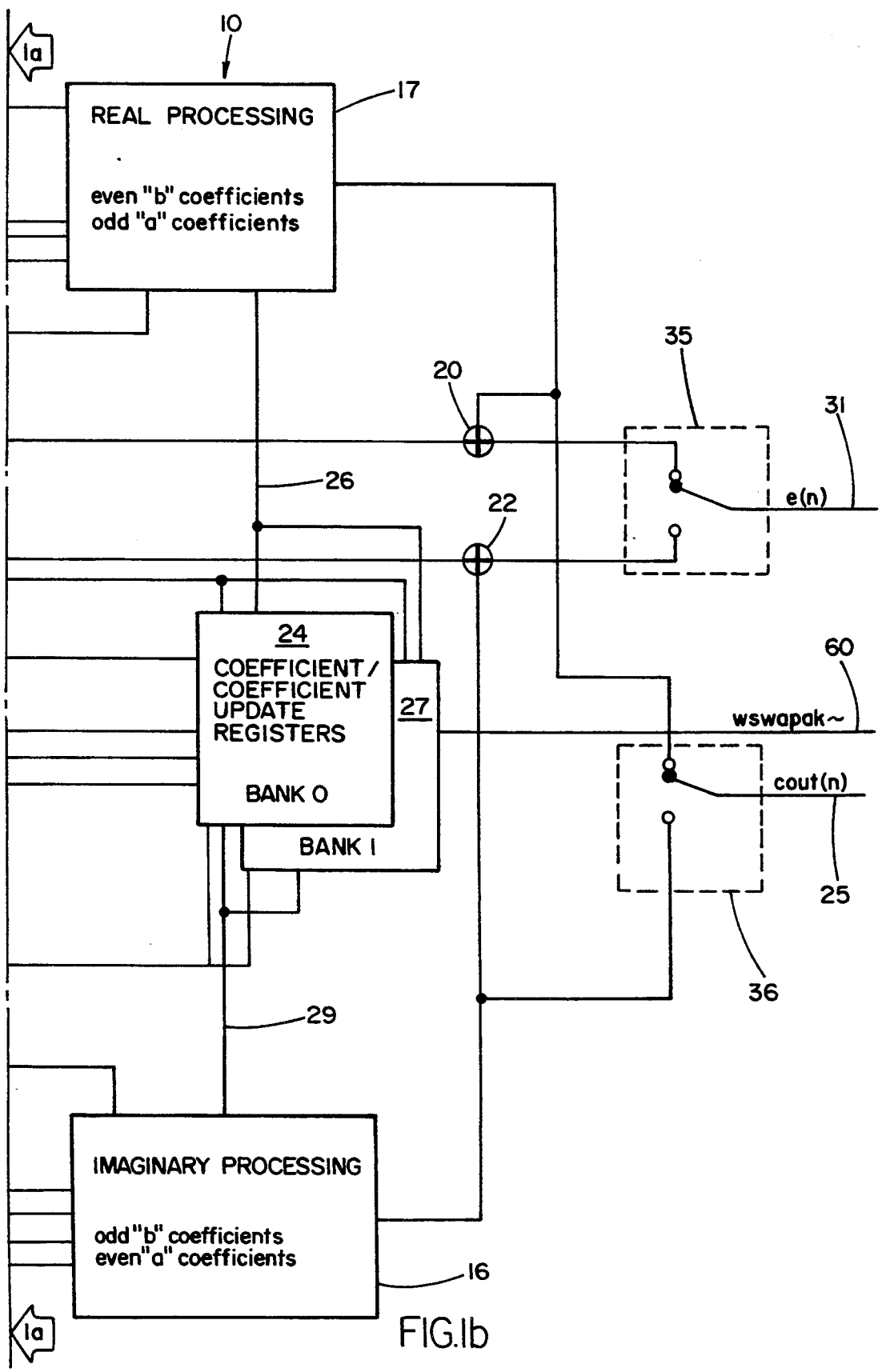

FIGS. 1a and 1b illustrate a block diagram of the complex adaptive finite impulse response filter 10 of the present invention. Correspondingly, FIG. 9 shows a pin-out summary of the I/O for the filter 10. Referring to FIG. 1a, the complex digital signal being processed by the filter 10, Yin(n), is input to the filter 10 via reference input signal line 12. Yin(n) is a multiplexed digital signal having a real input data portion and imaginary input data portion. It can be, for e.g., a pulsed radar return signal that has been sampled at a XMHz clock rate, separated into its real and imaginary components, and time multiplexed. The reference input signal line 12 is connected to a first switching circuit 32 which provides Yin(n) to both the real processing circuit 17 and the imaginary processing circuit 16 in either position. For instance, in one position, Yin(n) is multiplied with adaptive weights having real coefficient data in both the real and imaginary processing circuits 17 and 16, and in the second position, Yin(n) is multiplied with adaptive weights having imaginary coefficient data in both the real and imaginary processing circuits 17 and 16. It should be understood that the inputs Yin(n), Din(n), Cin(n) and the output signals Cout(n) and E(n) are complex digital data signals having real and imaginary parts. These inputs are a multiplexed stream of data with the real input data portion input first and the imaginary input data portion input next. Switching circuits 32, 33, and 34 are essentially demultiplexers which provide the real and imaginary input data portions to the respective real data and imaginary data processing circuits. The switching circuits are all shown in the FIG. 1a as single throw double pole switches, but it should be understood that any circuitry which switches a signal between two inputs on every clock can be used for the demultiplexing function. Likewise, as showN in FIG. 1b, switching circuits 35 and 36 function as multiplexers that form a continuous stream of real and imaginary parts of a complex signal along a single data output line.

The desired input signal Din(n), is input to the filter 10 via desired input signal line 13. The desired input signal line 13 is connected to a second switching circuit 33 which provides Din(n) to either a first summing circuit 20 or a second summing circuit 22. The real data portion of the desired input signal Din(n) is added to the real portion of the output signal Cout(n) when the second switching circuit 33 is switched to route Din(n) to the first summing circuit 20. The imaginary data portion of Din(n) is added to the imaginary portion of the output signal Cout(n) when the second switching circuit 33 routes Din(n) to the second summing circuit 22. In the preferred embodiment, the Din(n) input provided to the respective summing circuits is switched in at the XMHz clock rate however, it must be externally delayed depending upon the length of the filter i.e., the number of weights, in order to account for the latency of the filter 10.

A write strobe or write enable signal, Wr, is input to the filter 10 via a write strobe signal line 14. The write enable signal, Wr, is transmitted from the host processor (not shown) and functions to latch the coefficients into the respective coefficient/coefficient update memory banks 24 and 27 during the coefficient updating process to be described in detail below.

Address lines Adr(2:Φ), via signal lines 15, are the address lines which access the individual coefficient registers in memory banks 24 and 27. These are transmitted by a host processor and input to address decode circuit 28 where they are decoded to obtain six REG-SELECT(5:Φ) signals, 44, that address the individual coefficient registers in the coefficient/coefficient update memory banks 24 and 27. Signal Ce, input to filter 10 via signal line 18, is used to gate the address decoder 28 to make the filter 10 look like a memory-mapped peripheral to a host processor.

The clock input to the filter 10 is labelled XMHz and is shown in FIG. 1a input line 19. This clock controls the filter and runs at the real data rate which is two times the complex data rate. As will be described in detail below with reference to the timing diagram of FIGS. 4a and 4b, the control signals 40, 42 that are used to control the flow of data into the real and imaginary processing circuits, are generated by control circuitry 30. Control circuitry 30, it will be appreciated, also provides the signals that control the switching of input switching circuits 32, 33, and 34 and output switching circuits 35 and 36.

The signal WSWAPREQ that is input to the filter via line 21 is the weight swap request signal and it provides an indication to the weight swapping circuitry 38 that a change of banks is required.

The DATAIN signal input via line 23 provides the floating point coefficient data to the coefficient registers addressed by adr(2:Φ) and REGSELECT(5:Φ). DATAIN, 23 may comprise a 32-bit bus. Both DATAIN and WSWAPREQ signals are transmitted from a host processor.

The filter 10 is expandable in that it can be cascaded to provide for more coefficients and hence, handle larger amounts of data. The cascade input Cin(n), is input to the filter 10 via cascade input signal line 24. The cascade input signal line 24 is connected to a third switching circuit 34 which may provide the real data portion of a Cout(n) signal from a preceding filter stage to the real processing half 17 of the filter as well as provide the imaginary data portion of Cout(n) from a preceding filter stage to the imaginary processing half 16 of the filter. The cascade output signal Cout(n), is the cascade output of filter 10 and is output via signal line 25, which is connected to a fourth switching circuit 36. Switching circuit 36 is a demultiplexer that switches between the real output data from the real processing circuit 17 and the imaginary output data from the imaginary processing circuit 16 to produce the complex signal Cout(n) at output signal line 25.

The error signal E(n) is the error output which is essentially a summation of the desired input signal Din(n), 13, with both the real and imaginary output data available at Cout(n). The error signal is output via output signal line 31, which is connected to a fifth switching circuit 35. The real output portion of error signal E(n) is a summation in the first summing circuit 20, wherein real data portion of Din(n) is added to the real output data from the real processing circuit 17. The imaginary output portion of error signal E(n) is a summation in the second summing circuit 22, where the imaginary data portion of Din(n) is added to the imaginary output data from the imaginary processing circuit 16. Due to the circuit which implements filter 10, the real part of the first term of a complex correlation or convolution will be present at the output of the filter after 2*N clock cycles, where 'N' is the number of weights the filter is implementing. Thus, as mentioned above, the Din(n) signal is delayed by external control means at least 2*N clock cycles to account for the latency of the filter.

Figure 2:
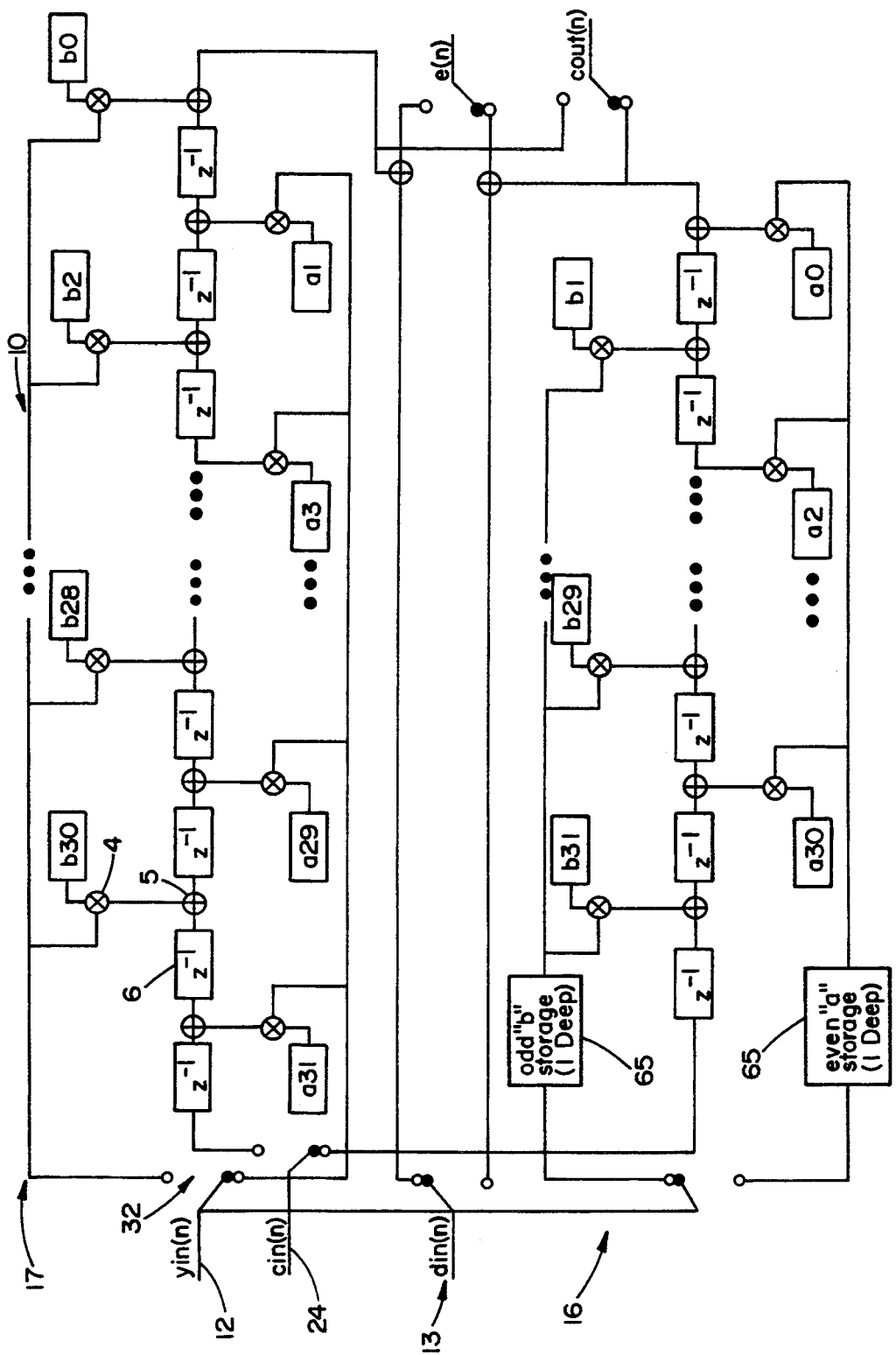
FIG. 2 shows a general block diagram conceptually illustrating the adaptive filter having two sets of parallel paths; one set for processing the real data portion of the input signal and the other set for processing the imaginary portion of the input signal.

Referring now to FIG. 2 there is shown a generalized block diagram of a 32 complex weight FIR filter 10 having a real processing circuit 17 and imaginary processing circuit 16. The switching circuit 32 is shown in a first position where the real input data portion of the input signal (hereinafter "Re[Yin(n)]" is connected to the half of the real processing circuit 17 having the odd numbered "a" coefficients and simultaneously connected to the half of the imaginary processing circuit 16 having the odd numbered "b" coefficients through a single clock cycle storage element 65. Hereinafter, the connection to the odd "a" and odd "b" coefficients will be referred to as a connection to the odd side coefficients. As can be seen, this is configured conceptually as a first parallel data path for processing the real data input of Yin(n). When the switching circuit 32 is in a second position, as dictated by control circuitry 30 to be explained below, the imaginary input data portion of the input signal hereinafter "Im[Yin(n)]" is connected to the half of the real processing circuit 17 having the even numbered "b" coefficients and simultaneously connected to the half of the imaginary processing circuit 16 having the even numbered "a" coefficients through a single clock cycle storage element 65. Hereinafter the connection to even "a" and even "b" coefficients will be referred to as a connection to the even side coefficients. This configuration illustrates conceptually a second parallel data path for processing the imaginary data input of Yin(n). The storage elements 65 in the paths of the imaginary processing circuit 16 provide the delay necessary to multiplex the real and imaginary output of the filter.

It should be readily understood to those skilled in the art that complex signal processing (e.g. convolution or correlation) involves multiplication of the input signal with a select set of real and imaginary multiplicands, i.e. coefficients, such that when the results are accumulated, a complex output signal is formed. Note that the geometry of the complex filter of the present invention is configured so that the top portion 17 of FIG. 2 will have coefficients such that when they are multiplied with Yin(n) and selectively accumulated, a real output data portion of the filter 10 is obtained. The bottom portion 16 will have the coefficients that will produce the imaginary output data portion of the filter 10. All even and odd side coefficients are weights having values that are dependent upon the type of function the filter is to perform, e.g. complex correlation or convolution. The real and imaginary data portions of Yin(n) are multiplied with the corresponding coefficients stored in the coefficient memory banks 24, 27 and each multiplication is accomplished by a multiplier circuit 4. Delay elements, labeled 6 in FIG. 2, are used for illustrative purposes to signify that the inputs are to be stored in the accumulator for one clock cycle before they appear at the output. In the preferred embodiment, the delay elements 6 are not implemented as such, but rather the control circuit 30 and control signals 39 (see FIGS. 1a and 1b) controlling the multiplier circuits 4 and accumulator circuits 5 properly account for the delay. Each accumulator circuit 5 is a summing circuit that adds two inputs to produce an output out of the right land side of the accumulator. For instance, the accumulator 5 shown in FIG. 2 will add the multiplication result of $a_{31}$*Re[Yin(n)] with the result of the multiplication of $b_{30}$ with Im[Yin(n)] one clock cycle after the 'b' side multiplication has taken place. With reference to the description of the timing diagram of FIGS. 4a and 4b it will be appreciated that the use of parallel paths takes maximum advantage of the time available to do the required multiplications and accumulations.

Figure 4A:
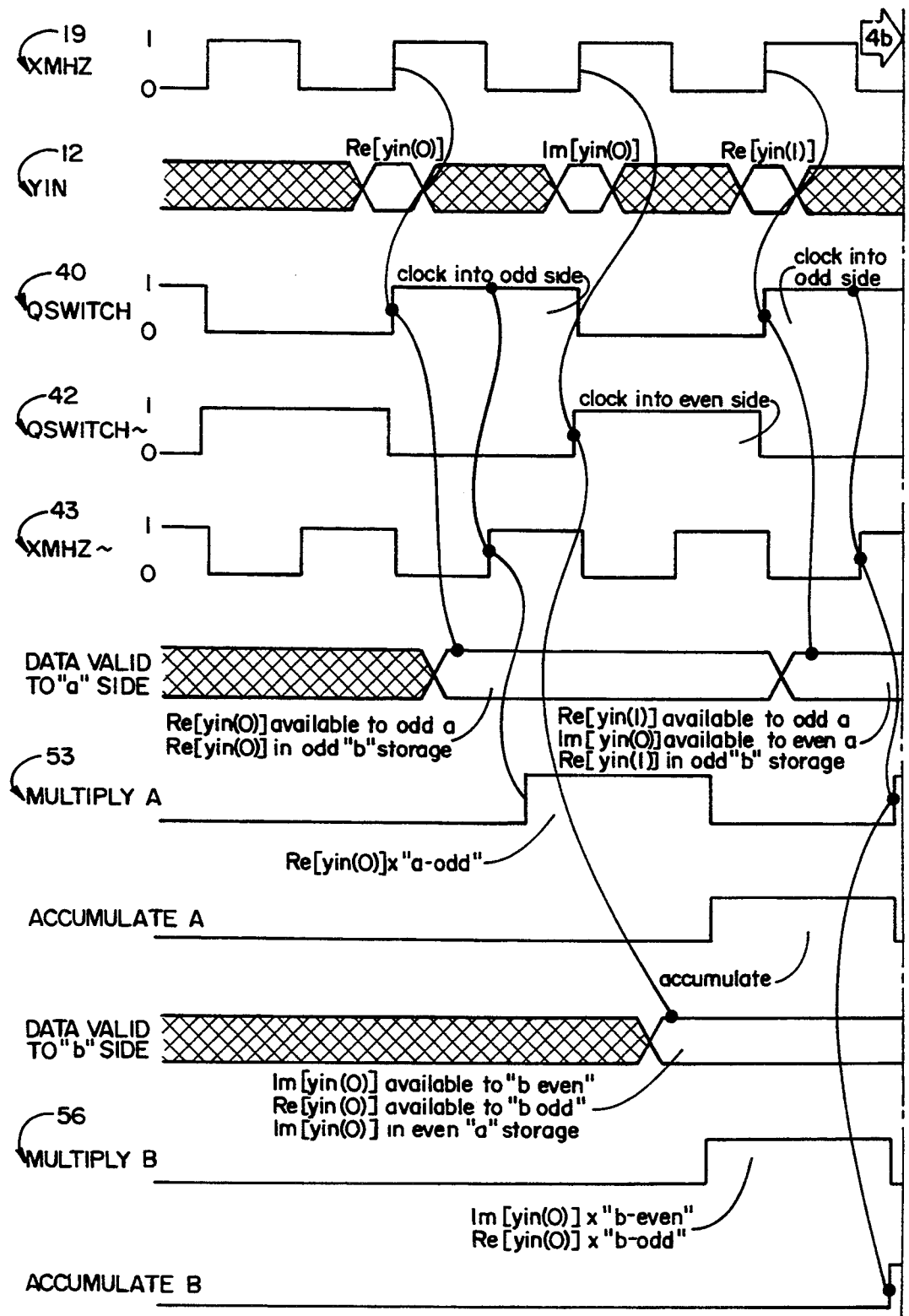
FIGS. 4a and 4b illustrate a timing diagram for the input signals and the internal control sequences of the complex adaptive FIR filter.
Figure 4B:
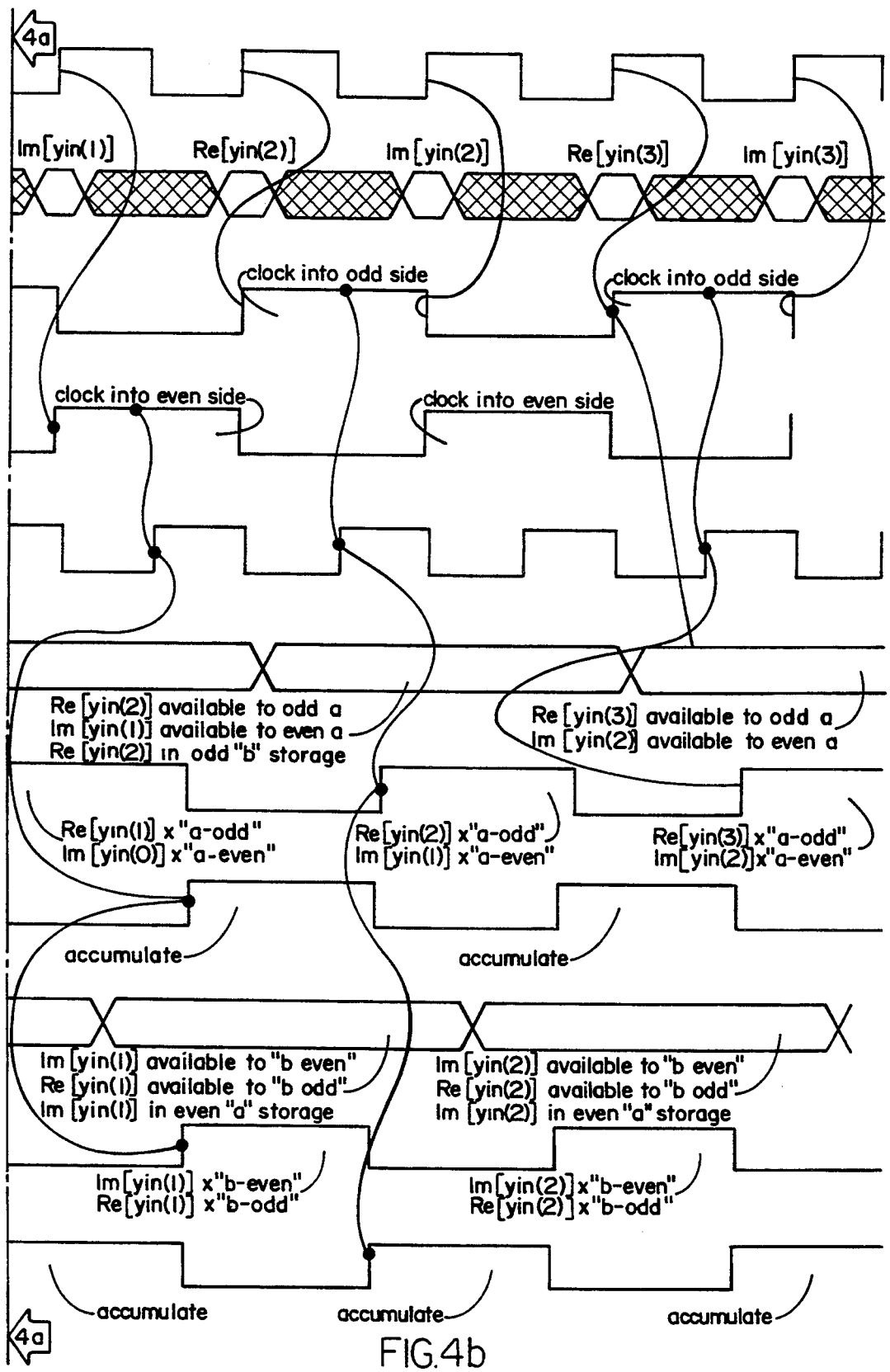

FIGS. 4a and 4b illustrates the timing sequence that is implemented by control circuitry 30 and control signals 39 to steer the real and imaginary inputs to the multipliers 4 and accumulators 5. The input Yin(n) is clocked in on a XMHz Clock 19. The data input to the real and imaginary processing circuitry is controlled by the signal QSWITCH which is signal 40. This signal is used to control switching circuit 32 to switch the input signal Yin(n), signal 12, between the multipliers 4 connected to the 'a' side coefficients and the 'b' side coefficients. The rising edge of QSWITCH signal 40 is used to clock the Re[Yin(n)] into the odd side while the falling edge of QSWITCH, via signal QSWITCH signal 42, clocks Im[Yin(n)] into the even side. [As can be seen from the Figure, QSWITCH and QSWITCH run at one-half the XMHz clock frequency.] Since the real and imaginary data processing proceed in parallel, the real data is multiplied by both the odd 'b' and odd 'a' coefficients and the imaginary data is multiplied by both the even 'a' and even 'b' coefficients. The imaginary processing is delayed by one clock in order to provide the correct multiplexed output.

Once the real data is made available to the odd side multipliers, the multiplication of Re[Yin(n)]*'a'odd and Im[Yin(n−1)]*'a'even coefficients will begin on the rising edge of XMHz (signal 43) which is the inverted XMHz clock signal. This 'a' side multiplication will take place when QSWITCH 40 is high (i.e. Logic 1). When QSWITCH 40 is low, the rising edge of XMHz will start the 'b' side multiplication, i.e., Im[Yin(n)]*'b'even coefficient and Re[Yin(n−1)]*'b'odd coefficients. The accumulation of results obtained from the previous multiplications involving 'b' side coefficients is performed at the time the multiplication of 'a' side coefficients take place. Similarly, the accumulation of results obtained from the previous multiplications involving 'a' side coefficient is performed at the time the multiplication of 'b' side coefficients take place. Once the accumulating has begun on the 'a' side, it is possible to switch to the alternate 'a' coefficient registers since the old coefficients are no longer needed and are not being utilized by the multipliers. Likewise, when the accumulating has begun on the 'b' side, it is possible to switch to the alternate 'b' coefficient registers. Changing access of data from one set of 'a' and 'b' coefficient registers from memory bank 24 (e.g., Bank 0) to the other set of 'a' and 'b' coefficient memory registers from memory bank 27 (e.g. Bank 1) will be referred to as "weight swapping" and this feature will be described in detail below.

As can be seen from the FIGS. 4a and 4b, QSWITCH 40 and QSWITCH 42 run at one-half the XMHz clock frequency. Thus, the internal calculations proceed at a rate of X/2 MHz while the output of the filter is maintained at the XMHz data rate. In this particular embodiment, each multiply and accumulate cycle takes $2/X \times 10^3$ ns to complete (using an XMHz clock). In conventional FIR filter designs, the multiply must take place in the shorter time span $1/X \times 10^3$ ns (i.e., at the XMHz clock rate).

As mentioned above, the coefficient/coefficient update memory bank 24 and the alternative coefficient/coefficient update memory bank 27 supply all the 'a' side and 'b' side coefficient values to the respective multipliers 4 (FIG. 2). The arrangement shown in FIGS. 1a and 1b allows for easy conceptualization of the process. As shown therein, both coefficient memory banks 24 and 27 will provide the even 'b' and odd 'a' coefficients to the real processing circuit 17 of the filter and the even 'a' and odd 'b' coefficients to the imaginary processing half 16 of the filter. The respective 'a' and 'b' coefficients are broadcast to the multipliers in the real or imaginary processing circuits 17 or 16 via respective weight use signal lines 26 and 29.

Different arrangements may be possible for swapping the coefficients in memory bank 24 or Bank Φ and memory bank 27 or Bank 1. For example, a more efficient arrangement might require half as many coefficients and consequently half as many registers if the register values can be broadcast to two multipliers and the accumulators are given the capability of subtraction as well as addition. This is true in view of the fact that in complex correlation calculations the first imaginary coefficient e.g., $a_0$ is equal to the succeeding real coefficient $a_1$ and the first real coefficient $b_0$ is equal to the negative of the succeeding imaginary coefficient $b_1$ as will be shown below.

The weight swapping feature of the present invention will now be described with reference to the timing diagrams of FIGS. 4a and 4b and 7. In view of FIGS. 4a and 4b, and as heretofore mentioned, the 'a' side and 'b' side coefficients are updated when each respective 'a' side and 'b' side accumulation is taking place i.e., when the coefficients are not being used by the multipliers 4. As can be seen, there is no time when both the 'a' side and the 'b' side coefficients are not being used by the multipliers, so each must be swapped separately.

Figure 7A:
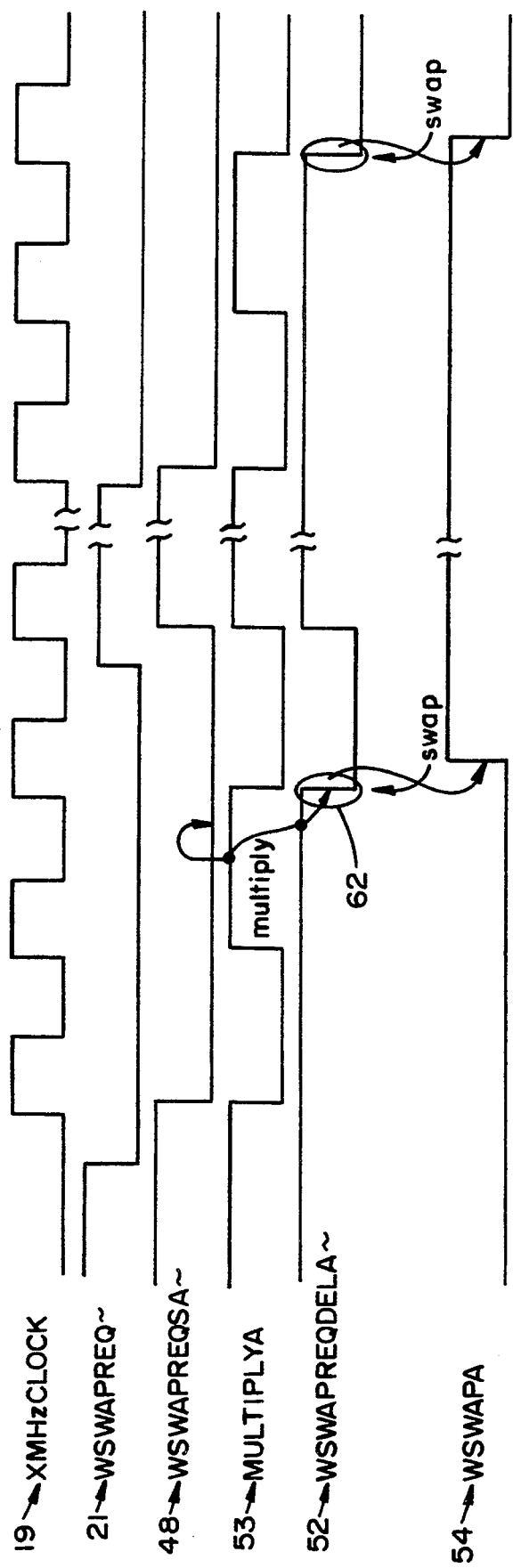
FIG. 7a shows a timing diagram of the signals utilized during the weight coefficient updating (i.e., weight swapping) process when implemented in the adaptive filter of the present invention.

The weight swap circuitry 38 (see FIGS. 1a and 1b) provides the timing and control signals necessary to accomplish the weight swapping function in the real and imaginary coefficient/coefficient update memory banks 24 and 27. The control and timing signals used during the weight swapping process are shown in FIG. 7a. The signals WSWAPA, 54, and WSWAPB, 58, that are generated by weight swapping circuitry 38, actually cause the corresponding 'a' side and 'b' side weight swapping to occur. Input to the weight swapping circuitry 38 are the XMHz clock, signal 19, WSWAPREQ~, signal 21, and MULTIPLYA and MULTIPLYB, which are signals 53 and 56 generated from control circuitry 30.

With reference to FIGS. 7a and 8, the swapping of the 'a' side coefficients between Bank Φ and Bank 1 will now be explained. It should be understood that the same timing diagram shown in FIG. 7a applies to the swapping of 'b' side coefficients. The input WSWAPREQ~ (21) generated from the host indicates that the host has updated the coefficients in the register bank not being used by the filter. The weight swap request WSWAPREQ~ (21) is synchronized with the XMHz clock (19) to produce the weight swap request synch WSWAPREQSA~ which is signal 48. When swapping 'a' side coefficients, this signal is represented as WSWAPREQSA~. FIG. 7b sets forth the truth table 70 describing the logic governing the production of the following signals: WSWAPREQSA~ (signal 48); weight swap request delay A, WSWAPREQDELA~ (signal 52); weight swap request delay B, WSWAPREQDELB~ (signal 55); weight swap acknowledge A, WSWAPAKA~ (signal 57); weight swap acknowledge B, WSWAPAKB~ (signal 59); weight swap acknowledge, WSWAPAK~ (signal 60). The legend shown in FIG. 7b provides the definitions of the symbols used in the truth table of FIG. 7b. For instance, the WSWAPAK~ signal 60 will go low (logic Φ) on the next clock if signal 57, WSWAPAKA~, and signal 59, WSWAPAKB~, are both low. The WSWAPAK~ signal 60 is thus generated and output from the filter when both 'a' side and 'b' side coefficients have been swapped. Note that the swapping logic circuitry 38 implementing the logic set forth in the truth table 70 of FIG. 7b may be implemented by programmable array logic, but preferably is implemented in the ASIC.

As previously mentioned, the WSWAPA signal 54 causes the weight swapping on the 'a' side to occur. The signal WSWAPREQDELA~ (52) waits for the MULTIPLYA, signal 53, before generating the WSWAPA signal 54. This condition indicates that on the next clock, the 'a' side multiply will be completed and the accumulate will begin. As can be seen in FIGS. 7a and 7c, WSWAPA is generated as an output of the J-K flip-flop 61 at the falling edge 62 of WSWAPREQDELA~ (signal 52). Note that after an 'a' side swap has occurred, the WSWAPAKA~, signal 57, is asserted according to the logical condition as set forth in truth table 70.

The WSWAPB signal 58, which causes the swapping of the 'b' side coefficients after the 'a' side swap has occurred, is generated as an output of a second J-K flip-flop (not shown) at the falling edge of WSWAPREQDELB~ (signal 55). Before the 'b' side swap occurs, WSWAPREQDELB~ waits for the combination of signals MULTIPLYB (signal 56) and WSWAPAKA~ (signal 57) in accordance with the logic as dictated by the swapping logic truth table 70 of FIG. 7b. After a 'b' side swap has occurred, the WSWAPAKB~ signal 59 is asserted in accordance with the logical condition as set forth in truth table 70 of FIG. 7b.

The advantages of the two memory bank architecture for each half of the filter are readily apparent. First of all, maximum filter processing time is made available because, for e.g., while the accumulation of the results obtained from the multiplications of the input data with 'a' side coefficients presently loaded into Bank Φ are taking place, a new set of updated 'a' side coefficients in Bank 1 memory can be made accessible to the multipliers. This ensures that valid 'a' side coefficients are always made available so there is no interruption of the filtering process. Likewise, for the 'b' side coefficients although there is a one clock cycle delay.

With conventional prior art filters, it takes more than one clock cycle to write data into a memory bank of registers after that bank has supplied the coefficients for multiplication with the input during a previous clock cycle. Thus, in a filter having one coefficient memory bank, the new set of coefficient data could not be loaded into that memory bank during the accumulation cycle which nominally lasts for one clock cycle (see FIGS. 4a and 4b). Hence, after the accumulate cycle is complete, there would be a filter processing time delay existing for the amount of time it takes to finish loading new coefficient data into the memory bank. During this time delay, no multiplication could take place and filter performance is degraded.

With applicant's two Bank architecture, while the filter is operating with data present in the first coefficient memory bank, the alternative memory bank, i.e., the one not being used by the filter, is being updated with the new set of coefficients. This ensures that under the control of the weight swap circuitry, after the accumulation has taken place, multiplication with new coefficients loaded into the alternative bank can immediately take place with no time lapse. Hence, with no filter processing time delay, the complex data output rate of the filter is equal to the complex data input rate. As noted above, it should be appreciated that coefficient data will be initially loaded into the first coefficient memory bank (e.g. Bank Φ). Subsequent updated coefficient data is successively loaded into the alternate memory bank, i.e., the one not being used by the multipliers, after each weight swap request under the automatic control of the weight swap circuitry.

The writing of coefficient data to the memory banks during the weight swapping process will now be explained with respect to FIG. 8. FIG. 8 shows how the 'a' side coefficients are swapped between coefficient registers in Bank Φ and Bank 1. It is understood that when the coefficient registers containing 'a' side coefficients in Bank Φ are being accessed by the filter 10, the coefficient registers containing 'a' side coefficients in Bank 1 may be accessed by the host computer for writing updated 'a' coefficient data thereto and vice versa. 'b' side coefficients are swapped similarly, i.e., the 'b' side coefficients registers in Bank Φ are either being accessed by the filter 10 or host computer at any one time.

In operation, the individual 'a' side coefficient registers are accessed to receive data that is present on the DATAIN bus 23. As shown in FIG. 8, WSWAPA signal 54, together with Wr~ signal 14, determine which coefficient/coefficient update memory bank is being accessed by the filter 10, (e.g. Bank Φ), and which memory bank is to receive the updated coefficients (e.g. Bank 1). The REGSELECT(5:Φ), signal 44, selects which individual coefficient register in the selected memory bank, i.e. registers CΦ through C5, is to receive the data present on DATAIN. As mentioned previously, DATAIN contains floating point coefficients, up to 32 bits, for enhanced mathematical precision. An identical operation is performed when coefficients are being updated to the alternate coefficient/coefficient update memory Bank Φ while the coefficients present in Bank 1 are being accessed by the filter 10. Again, WSWAPA, signal 54, together with Wr~, signal 14, determine that the coefficient registers in Bank Φ are to receive updated coefficient data. The REGSELECT(5:Φ), signal 44, will then select which individual coefficient register in the Bank Φ is to receive the updated coefficient data present on DATAIN.

The same processes mentioned above apply to swapping the 'b' side coefficients as well. For the case of updating 'b' side coefficients, the signal WSWAPB (58) together with Wr~ (14) determine which weight/weight update memory bank is being accessed by the filter 10, (e.g. Bank Φ), and which memory bank is to receive the updated coefficients (e.g. Bank 1,) and vice versa. It will be appreciated that the filter looks like a memory mapped peripheral to the host and that the coefficients are downloaded to sequential memory locations. Although it is not shown in FIG. 8, the Ce~ signal 18 in FIG. 1a must be asserted while the Wr~ (14) signal is activated as is standard practice with memory mapped peripherals.

Example of a 3 Complex Weight Filter

A complex correlation of two vectors will be described to illustrate how the filter of the present invention is utilized for digital signal processing applications. An N-weight complex correlation conceptually requires $2 \times 2N$ coefficients. In this example, a 3-weight complex correlation is performed, and accordingly, 12 coefficients are required. The scope of the present invention should however not be limited to any particular number of coefficients except that these must be an even number per section for the cascading to work correctly. After the derivation of the coefficients for a 3-weight complex correlation, it will be shown that there are actually only six unique coefficients. In a preferred embodiment, a method for implementing the filter using only six coefficients will be shown.

Figure 5:
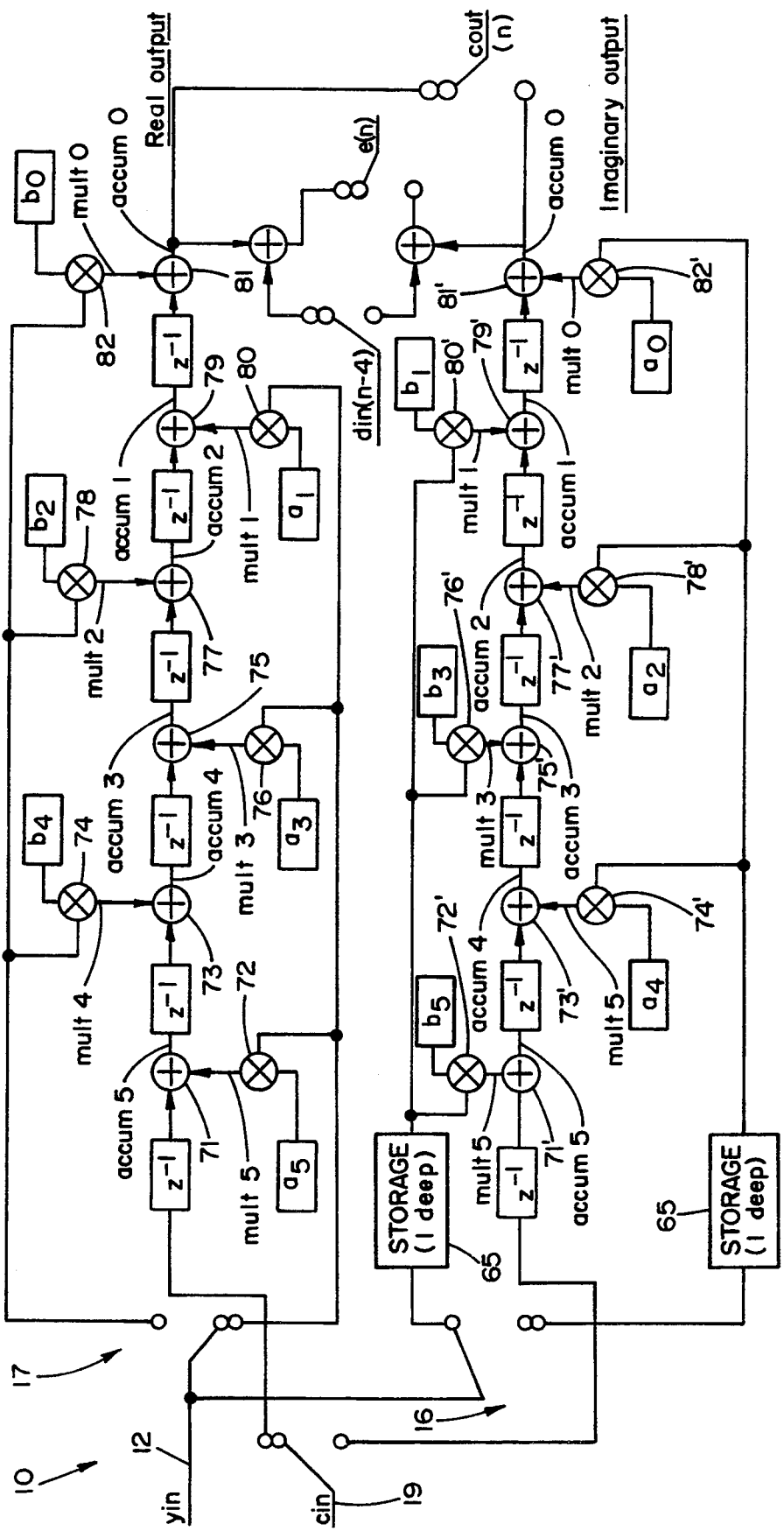
FIG. 5 shows the block diagram representation of the filter when designed as a 3 complex weight filter.

A 3-weight filter is illustrated in FIG. 5. The implementation of the 3-weight complex filter is described to prove the design including the cascade in from the higher order coefficients to the lower order coefficients and the summing of the filter output with the desired input to produce the error term.

A common digital signal processing function which is implemented as a FIR filter is a complex correlation. The complex correlation of two vectors is given by $$R_{wy}(m) = \sum_{K=0}^{N-1} w^*(k)y(k + m) \quad (1)$$

where $w^*(k)$ is the complex conjugate of the weight vector $w(k)$, $y(k+m)$ is a time shifted version of reference input signal $y(m)$, and N is the number of complex coefficients, which is equal to 3 in this example. Expanding the summation in equation (1) for m equal to 0 results in $$R_{wy}(0) = w^*(0)y(0) + w^*(1)y(1) + w^*(2)y(2) \quad (2)$$

The weight vector, $w(k)$, is given by $$w(k) = rw(k) + j[iw(k)] \quad (3)$$

wherein rw(k) is the real part of the weight vector and [iw(k)] is the imaginary part of the weight vector.

Expanding equation (3) for values of k ranging from $\Phi$ to $N-1$ results in $$w(0)=rw(0)+j[iw(0)]$$
$$w(1)=rw(1)+j[iw(1)]$$
$$w(2)=rw(2)+j[iw(2)] \quad (4)$$

The complex conjugate of the weight vectors of equation (4) are given by $$w^*(0)=rw(0)-j[iw(0)]$$
$$w^*(1)=rw(1)-j[iw(1)]$$
$$w^*(2)=rw(2)-j[iw(2)] \quad (5)$$

The reference input vector, $y(k+m)$, is given by $$y(0)=ry(0)+j[iy(0)]$$
$$y(1)=ry(1)+j[iy(1)]$$
$$y(2)=ry(2)+j[iy(2)] \quad (6)$$

Substituting equations (5) and (6) into equation (2) results in $$\begin{aligned}Rwy(0) &= (rw(0) - j[iw(0)])(ry(0) + j[iy(0)]) \\ &+ (rw(1) - j[iw(1)])(ry(1) + j[iy(1)]) \\ &+ (rw(2) - j[iw(2)])(ry(2) + j[iy(2)])\end{aligned} \quad (7)$$

Expanding equation (7) results in $$\begin{aligned}Rwy(0) &= rw(0)ry(0) - j[iw(0)]ry(0) + iw(0)iy(0) + rw(0)j[iy(0)] \\ &+ rw(1)ry(1) - j[iw(1)]ry(1) + iw(1)iy(1) + rw(1)j[iy(1)] \\ &+ rw(2)ry(2) - j[iw(2)]ry(2) + iw(2)iy(2) + rw(2)j[iy(2)]\end{aligned} \quad (8)$$

Rearranging equation (8) into the real and imaginary parts results in $$\begin{aligned}Rwy(0) &= rw(0)ry(0) + iw(0)iy(0) \\ &+ rw(1)ry(1) + iw(1)iy(1) \\ &+ rw(2)ry(2) + iw(2)iy(2) \\ &+ j[rw(0)iy(0) - ry(0)iw(0) \\ &+ rw(1)iy(1) - ry(1)iw(1) \\ &+ rw(2)iy(2) - ry(2)iw(2)]\end{aligned} \quad (9)$$

The reference input, $Y_{in}$, enters the filter real part first, and accordingly, the values for $y_{in}$ are given by $$y_{in}(0)=ry(0)$$
$$y_{in}(1)=iy(0)$$
$$y_{in}(2)=ry(1)$$
$$y_{in}(3)=iy(1)$$
$$y_{in}(4)=ry(2)$$
$$y_{in}(5)=iy(2) \quad (10)$$

The coefficients are chosen based upon the specific implementation of the filter shown in FIG. 5, and are given by:

$$\begin{aligned}a_0 &= rw(2) & b_0 &= iw(2) \\ a_1 &= rw(2) & b_1 &= -iw(2) \\ a_2 &= rw(1) & b_2 &= iw(1) \\ a_3 &= rw(1) & b_3 &= -iw(1) \\ a_4 &= rw(0) & b_4 &= iw(0) \\ a_5 &= rw(0) & b_5 &= -iw(0)\end{aligned} \quad (11)$$

It is clear that $a_0=a_1$, $a_2=a_3$, $a_4=a_5$, $b_0=-b_1$, $b_2=-b_3$, and $b_4=-b_5$. Thus, In a preferred embodiment, only the coefficients $a_0$, $a_1$, $a_2$, $a_4$, $b_0$, $b_2$, and $b_4$ need be provided. Thus, with reference to FIG. 5, $a_0$ would be broadcast to both multiplier circuits 82' and 80; $a_2$ would be broadcast to multiplier circuits 78' and 76; $a_4$ would go to multiplier circuits 74' and 72; $b_0$ would be broadcast to multiplier circuits 82 and 80'; $b_2$ would be broadcast to 76' and 78; and $b_4$ would be broadcast to 72' and 74. Substituting the coefficients of equation (11) and the values of the reference inputs of equation (10) into equation (9) results in $$\begin{aligned}Rwy(0) &= a_5 y_{in}(0) + b_4 y_{in}(1) + a_3 y_{in}(2) + b_2 y_{in}(3) \\ &+ a_1 y_{in}(4) + b_0 y_{in}(5) + j[b_5 y_{in}(0) + a_4 y_{in}(1) \\ &+ b_3 y_{in}(2) + a_2 y_{in}(3) + b_1 y_{in}(4) + a_0 y_{in}(5)]\end{aligned} \quad (12)$$

The complex correlation, $Rwy(0)$, in terms of filter output is given by $$Rwy(0)=Cout(6)+jCout(7) \quad (13)$$

wherein Cout(6) is the real part of $Rwy(0)$ and Cout(7) is the imaginary part of $Rwy(0)$. Equation (13) is the result of the mathematical calculation of the complex correlation of two vectors.

Referring to FIG. 5, the block diagram representation of the filter is utilized to demonstrate that the operation of the filter corresponds to the mathematical result achieved above. Each device in FIG. 5 is identified by a name and a number corresponding to the column headings in FIGS. 6A1 and 6B1. The processing which occurs in the top half of the FIR filter of FIG. 5 i.e., the real processing circuit 17, is tabulated in FIGS. 6A1 through 6A3 and corresponds to the real output of the 3-weight complex filter. The bottom half of FIG. 5 i.e., the imaginary processing circuit 16, is tabulated in FIGS. 6B1 through 6B3 and corresponds to the imaginary output of the 3-weight complex filter design. The grid of the processing table shown in FIGS. 6A1 through 6A3, corresponding to the real processing circuit 17, makes use of equations 14 through 19 below.

Referring to the real path of the filter, the output accum5 of the sixth summing circuit 71 is given by $$accum5 = Cin + mult5, \quad (14)$$

wherein Cin is the cascade input 19 and mult5 represents the output of the sixth multiplying circuit 72. The output accum4 of the fifth summing circuit 73 is given by $$accum4 = accum5 + mult4, \quad (15)$$

where accum5 is given in equation (14) and mult4 represents the output of the fifth multiplying circuit 74. The output accum3 of the fourth summing circuit 75 is given by $$accum3 = accum4 + mult3, \qquad (16)$$

where accum4 is given in equation (15) and mult3 represents the output of the fourth multiplying circuit 76. The output accum2 of the third summing circuit 77 is given by $$accum2 = accum3 + mult2, \qquad (17)$$

where accum3 is given in equation (16) and mult2 represents the output of the third multiplying circuit 78. The output accum1 of the second summing circuit 79 is given by $$accum1 = accum2 + mult1, \qquad (18)$$

where accum2 is given in equation (17) and mult1 represents the output of the second multiplying circuit 80. The output accum$\Phi$ of the first summing circuit 81 is given by $$accum\Phi = accum1 + mult\Phi \qquad (19)$$

where accum1 is given in equation (18) and mult$\Phi$ represents the output of the first multiplying circuit 82.

Thus the results for the real output part of this 3-weight filter, Cout(n), is the output at time n, which in this case is equal to six. Thus, at the sixth clock cycle, the result Cout(6) corresponds to the result obtained mathematically in equation (12).

The processing table shown in FIGS. 6B1 through 6B3 corresponding to the imaginary processing circuit 16 of filter 10, makes use of equations 20 through 25 below. Referring to the imaginary path of the filter shown in FIG. 5, the output accum5 of the sixth summing circuit 71' is given by $$accum5 = Cin + mult5, \qquad (20)$$

wherein Cin is the cascade input 19 and mult5 represents the output of the sixth multiplying circuit 72'. The output accum4 of the fifth summing circuit 73' is given by $$accum4 = accum5 + mult4, \qquad (21)$$

where accum5 is given in equation (20) and mult4 represents the output of the fifth multiplying circuit 74'. The output accum3 of the fourth summing circuit 75' is given by $$accum3 = accum4 + mult3, \qquad (22)$$

where accum4 is given in equation (21) and mult3 represents the output of the fourth multiplying circuit 76'. The output accum2 of the third summing circuit 77' is given by $$accum2 = accum3 + mult2, \qquad (23)$$

where accum3 is given in equation (22) and mult2 represents the output of the third multiplying circuit 78'. The output accum1 of the second summing circuit 79' is given by $$accum1 = accum2 + mult1, \qquad (24)$$

where accum2 is given in equation (23) and mult1 represents the output of the second multiplying circuit 80'. The output accum$\Phi$ of the first summing circuit 81' is given by $$accum\Phi = accum1 + mult\Phi \qquad (25)$$

where accum1 is given in equation (24) and mult$\Phi$ represents the output of the first multiplying circuit 82'.

For the preferred embodiment of the 3-weight filter where only 2N or six coefficients are used, the filter would have to perform the subtraction wherein for e.g.: accum1 = accum2 − mult1; and accum3 = accum4 − mult 3 to accommodate the (−) signs in the $b_1$, $b_3$, and $b_5$ coefficients.

Thus the results for the imaginary output part of this 3-weight filter, Cout(n), is the output at time n, which is this case is equal to seven. Note that at the seventh clock cycle, the result Cout(7) corresponds to the imaginary portion of the result obtained mathematically in equation (12). The imaginary output Cout(7) is available at the seventh clock cycle due to the initial coefficient storage delay of one clock cycle implemented by the storage devices 65 in the imaginary processing path 16 of the filter. The delay of one clock cycle in this path is necessary to assure proper multiplexing of the Cout(n) signal 25, (filter output).

While the invention has been particularly shown and described with respect to the preferred embodiments thereof, it should be understood by those skilled in the art that the foregoing and other changes in form and detail may be made therein without departing from the spirit and scope of the invention which should be limited only by the scope of the appended claims.

What is claimed is:

1. A finite impulse response filter with adaptive weights for processing a complex data signal having both real and imaginary input data components, said finite impulse response filter comprising:

a) a first data processing circuit for generating a real data output component of a complex signal output for said filter, said first processing circuit having a first input connected to a first plurality of multiplier means for multiplying said real input data component with a first set of adaptive weights during a first time interval and successive first time intervals, and generating corresponding first sets of weighted data for output at each said multiplier means of said first plurality, and a second input connected to a second plurality of multiplier means for multiplying said imaginary input data component with a second set of adaptive weights during a second time interval and successive second time intervals, and generating corresponding second sets of weighted data for output at each said multiplier means of said second plurality;

b) a second data processing circuit for generating an imaginary output data component of said complex signal output for said filter, said second processing circuit having said first input connected to a third plurality of multiplier means for multiplying said real input data component with a third set of adaptive weights during said successive second time intervals, and generating corresponding third sets of weighted data for output at each said multiplier means of said third plurality, and said second input connected to a fourth plurality of multiplier means for multiplying said imaginary input data component with a fourth set of adaptive weights during successive first time intervals, and generating corresponding fourth sets of weighted data for output at each said multiplier means of said fourth plurality;

c) sampling means for inputting said real input data component at said first input during said first time interval and successive first time intervals thereafter, and for inputting said imaginary input data component at said second input during said second time interval and successive second time intervals thereafter;

d) a first input storage means located at said first input in said second data processing circuit for delaying the multiplication of said real input data component with said third plurality of multiplier means for one time interval and a second input storage means located at said second input in said second data path for delaying the multiplication of said imaginary input data component with said fourth plurality of multiplier means for one time interval;

e) first plurality of accumulator circuit means interconnecting outputs of each said first plurality of multiplier means with outputs of each said second plurality of multiplier means for successively accumulating selective first sets of weighted data and selective second sets of weighted data to form said real data output component of said complex output signal, and a second plurality of accumulator circuit means interconnecting outputs of each said third plurality of multiplier means with outputs of each said fourth plurality of multiplier means for successively accumulating selective third sets of weighted data and selective fourth sets of weighted data to form said imaginary data output component of said complex output signal;

f) control circuit means for simultaneously directing said first plurality of accumulator circuit means and said second plurality of accumulator circuit means to accumulate said first sets of weighted data and said forth sets of weight data, respectively, during successive said second time intervals, and for simultaneously directing said first plurality of accumulator circuit means and said second plurality of accumulator circuit means to accumulate said second sets of weighted data and said third sets of weighted data, respectively during successive said first time intervals; and g) coefficient swapping circuit means for updating the adaptive weight values of said predetermined coefficient sets, said means simultaneously updating the values of said first plurality and said fourth plurality of adaptive weights means during said successive second time intervals, and simultaneously updating the values of said second plurality and said third plurality of adaptive weight means during said successive first time intervals.

2. The filter according to claim 1 further including a memory storage means for storing said first plurality, second plurality, third plurality, and fourth plurality of adaptive weight values for their respective multiplications.

3. The filter according to claim 2 wherein said coefficient swapping circuit means directs said first, second, third, and fourth plurality of adaptive weight values to be loaded into said memory storage means at the request of said control means.

4. The filter according to claim 3 wherein said filter further includes an alternate memory storage means for receiving updated first plurality and updated fourth plurality of adaptive weight values while said first plurality and fourth plurality of adaptive weight values stored in said memory storage means are being utilized for multiplication thereof, said alternate memory storage means for receiving updated second plurality and updated third plurality of adaptive weight values while said second plurality and third plurality of adaptive weight values stored in said memory storage means are being utilized for multiplication thereof.

5. The filter according to claim 4 wherein said coefficient swapping circuit means generates a weight swap acknowledge signal to inform said control means that either said memory storage means is available to receive updated coefficient values or said alternate memory storage means is available to receive updated coefficient values.

6. The filter according to claim 1 further including means for generating an error signal for use by said processor means.

7. The filter according to claim 6 wherein said means for generating an error signal includes a first summing circuit means for adding said real output component for said filter with a desired real output signal and a second summing circuit means for adding said imaginary output component for said filter with a desired imaginary output signal.

8. The filter according to claim 1 wherein said control circuit means further includes means for multiplexing said real output data component from said first data processing circuit and said imaginary output data component from said second data processing circuit to form said complex output signal at an output end of said filter.

9. The filter according to claim 8 further including cascade output means for connecting said multiplexing means at said output end of said filter to a cascade input circuit means of a succeeding finite impulse response filter stage to thereby cascade said finite impulse response filters.

10. A method for processing complex digital data having both real and imaginary input data said method comprising the steps of:

a) alternately loading real input data into a first data path and imaginary input data into a second data path during successive time intervals, said first data path having a first plurality and second plurality of adaptive weight means having coefficient data with predetermined values and said second data path laving a third and fourth plurality of adaptive weight means having coefficient data with predetermined values;

b) storing said real input data in said first data path having said second plurality of adaptive weight means for one time interval after loading said real input data into said first data path, and storing said imaginary input data in said second data path laving said fourth plurality of adaptive weight means for one time interval after loading said imaginary input data into said second data path;

c) simultaneously multiplying during a first and successive first time intervals said real input data and imaginary input data respectively by said coefficient data values of said first plurality of adaptive weight means and fourth plurality of adaptive weight means to obtain respectively therefrom a first plurality and fourth plurality of multiplication results;

d) simultaneously multiplying during a second and successive second time intervals said imaginary input data and real input data respectively by said coefficient data values of said second plurality of adaptive weight means and third plurality of adaptive weights means to obtain respectively therefrom a second plurality and third plurality of multiplication results;

e) alternately accumulating the results of each of said first plurality and third plurality of multiplication results to form therefrom a real data output portion for said filter; and f) alternately accumulating the results of said second plurality and said fourth plurality of multiplication results to form therefrom an imaginary data output portion for said filter, wherein said first plurality and fourth plurality of multiplication results are accumulated simultaneously and said second plurality and said third plurality of multiplication results are accumulated simultaneously.

11. The method according to claim 10 further including the steps of updating the coefficient data values of said first plurality and fourth plurality of adaptive weight means during the accumulation of said first plurality and fourth plurality of multiplication results, and updating the coefficient data values of said second plurality and third plurality of adaptive weight means during the accumulation of said second plurality and third plurality of multiplication results.

12. The method according to claim 11 wherein said first and fourth plurality of adaptive weight means has associated therewith a first and first alternate memory storage means for storing said coefficient data, said updating step further including the step of alternately accessing said coefficient data values from either said first or alternate first memory storage means during an accumulation of said first plurality and fourth plurality of multiplication results.

13. The method according to claim 11 wherein said second and third plurality of adaptive weight means has associated therewith a second and second alternate memory storage means for storing said coefficient data, said updating step further including the step of alternately accessing said coefficient data values from either said second or alternate second memory storage means during an accumulation of said second plurality and third plurality of multiplication results.

* * * * *